(12) United States Patent  
De Kok et al.

(10) Patent No.: US 9,480,151 B2  
(45) Date of Patent: Oct. 25, 2016

(54) ASSEMBLY, METHOD OF ASSEMBLING, AND TILE FOR USE IN ASSEMBLY

(75) Inventors: Margaretha Maria De Kok, Eindhoven (NL); Jeroen Van Den Brand, Goirle (NL); Gerardus Titus Van Heck, Eindhoven (NL)

(73) Assignee: Nederlandse Organisatie voor toegepast-natuurwetenschappelij konderzoek TNO, Delft (NL)

( * ) Notice: Subject to any disclaimer, the term of this patent is extended or adjusted under 35 U.S.C. 154(b) by 0 days.

(21) Appl. No.: 13/574,789

(22) PCT Filed: Jan. 31, 2011

(86) PCT No.: PCT/NL2011/050062  
§ 371 (c)(1),  
(2), (4) Date: Sep. 6, 2012

(87) PCT Pub. No.: WO2011/093711  
PCT Pub. Date: Aug. 4, 2011

(65) Prior Publication Data  
US 2013/0201637 A1 Aug. 8, 2013

(30) Foreign Application Priority Data  
Jan. 29, 2010 (EP) .................................. 10152129

(51) Int. Cl.  
*H05K 1/00* (2006.01)  
*H05K 1/02* (2006.01)  
(Continued)

(52) U.S. Cl.  
CPC ......... *H05K 1/0277* (2013.01); *H01L 27/3293* (2013.01); *H01L 31/0392* (2013.01); *H01L 31/042* (2013.01); *H01L 51/5203* (2013.01); *H01R 4/70* (2013.01); *H05B 33/0896* (2013.01); *H05B 33/10* (2013.01); *H05K 3/325* (2013.01); *H05K 3/365* (2013.01); *H05K 13/04* (2013.01);  
(Continued)

(58) Field of Classification Search  
CPC .... H05K 1/0277; H05K 3/325; H05K 3/365; H01L 27/3293; H01L 51/5203; H01R 4/70  
USPC ........................................................ 361/749  
See application file for complete search history.

(56) References Cited

U.S. PATENT DOCUMENTS 3,255,047 A 6/1966 Escoffery  
5,212,916 A 5/1993 Dippel et al.  
(Continued)

FOREIGN PATENT DOCUMENTS

CN 2912199 Y 6/2007  
DE 102004021570 1/2005  
(Continued)

OTHER PUBLICATIONS

International Search Report, PCT/NL2011/050063, mailing date: Jul. 1, 2011.  
(Continued)

*Primary Examiner* — Tremesha S Willis  
(74) *Attorney, Agent, or Firm* — Banner & Witcoff, Ltd.

(57) ABSTRACT

An assembly of a plurality of tiles (1) with a carrier (40), wherein the tiles (1) comprise a foil (20) with an electrophysical transducer (10) and electrical connectors (24, 28) to said transducer. The tiles are mechanically and electrically coupled to the carrier, and the tiles overlay according to a fish scale pattern.

25 Claims, 11 Drawing Sheets

(51) Int. Cl.

| | | |
|---|---|---|
| *H01L 27/32* | (2006.01) | |
| *H01L 51/52* | (2006.01) | |
| *H01R 4/70* | (2006.01) | |
| *H05K 3/36* | (2006.01) | |
| *H05B 33/08* | (2006.01) | |
| *H05B 33/10* | (2006.01) | |
| *H05K 13/04* | (2006.01) | |
| *H01L 31/0392* | (2006.01) | |
| *H01L 31/042* | (2014.01) | |
| *G09F 9/00* | (2006.01) | |
| *G09F 19/22* | (2006.01) | |
| *H01R 4/04* | (2006.01) | |
| *H01R 12/70* | (2011.01) | |
| *H05K 1/03* | (2006.01) | |
| *H05K 1/14* | (2006.01) | |
| *H05K 1/18* | (2006.01) | |
| *H05K 3/32* | (2006.01) | |

(52) U.S. Cl.
CPC ............. *G09F 9/00* (2013.01); *G09F 19/22* (2013.01); *H01L 2251/5338* (2013.01); *H01L 2251/5361* (2013.01); *H01R 4/04* (2013.01); *H01R 12/7076* (2013.01); *H05K 1/0283* (2013.01); *H05K 1/038* (2013.01); *H05K 1/147* (2013.01); *H05K 1/189* (2013.01); *H05K 3/321* (2013.01); *H05K 2201/029* (2013.01); *H05K 2201/0311* (2013.01); *H05K 2201/046* (2013.01); *H05K 2201/083* (2013.01); *H05K 2201/09081* (2013.01); *H05K 2201/09281* (2013.01); *H05K 2201/10106* (2013.01); *H05K 2201/10287* (2013.01); *H05K 2201/10484* (2013.01); *Y02E 10/50* (2013.01); *Y10T 29/4913* (2015.01)

(56) References Cited

U.S. PATENT DOCUMENTS

| | | |
|---|---|---|
| 2004/0069341 A1 | 4/2004 | Heidrich |
| 2004/0192082 A1 | 9/2004 | Wagner et al. |
| 2004/0224138 A1 | 11/2004 | Farrell et al. |
| 2006/0005876 A1 | 1/2006 | Gaudiana |
| 2006/0056161 A1* | 3/2006 | Shin ................. G01L 19/146 361/749 |
| 2007/0115572 A1 | 5/2007 | Van Dam et al. |
| 2008/0302031 A1* | 12/2008 | Bressler et al. ............. 52/173.3 |
| 2009/0109368 A1 | 4/2009 | Watanabe et al. |

FOREIGN PATENT DOCUMENTS

| | | |
|---|---|---|
| DE | 102005041333 | 1/2007 |
| EP | 1369923 | 12/2003 |
| EP | 2107642 | 10/2009 |
| JP | S6265680 U | 4/1987 |
| JP | H10-335063 A | 12/1998 |
| JP | 2003-150144 A | 5/2003 |
| JP | 2004-251981 A | 9/2004 |
| JP | 2007-011177 A | 1/2007 |
| JP | 2009-139463 A | 6/2009 |
| JP | 2009-217984 A | 9/2009 |
| WO | 96/39707 A1 | 12/1996 |
| WO | 2008/007237 | 1/2008 |
| WO | 2008/099306 | 8/2008 |
| WO | 2008/120138 | 10/2008 |
| WO | 2009/133497 A1 | 11/2009 |
| WO | 2009/134127 A1 | 11/2009 |
| WO | 2010/067283 A1 | 6/2010 |

OTHER PUBLICATIONS

International Search Report, PCT/NL2011/050062, mailing date: Jun. 16, 2011.

International Search Report, PCT/NL2011/050064, mailing date: Aug. 9, 2011.

Linz T et al: "Embroidering Electrical Interconnects with Conductive Yarn for The Integration of Flexible Electronic Modules into Fabric". Wearable Computers. 2005. Proceedings. Ninth IEEE International Symposium on Osaka. Japan Oct. 18-21, 2005. Piscataway. NJ. USA.IEEE. Oct. 18, 2005. pp. 86-91. XP010859534. DOI: DOI:10.1109/ISWC.2005.19, ISBN: 978-0-7695-2419-1.

* cited by examiner

ASSEMBLY, METHOD OF ASSEMBLING, AND TILE FOR USE IN ASSEMBLY

CROSS-REFERENCE TO RELATED APPLICATIONS

This application is a U.S. National Stage application under 35 U.S.C. §371 of International Application PCT/NL2011/050062 (published as WO 2011/093711 A1), filed Jan. 31, 2011 which claims priority to Application EP 10152129.2, filed Jan. 29, 2010. Benefit of the filing date of each of these prior applications is hereby claimed. Each of these prior applications is hereby incorporated by reference in its entirety.

BACKGROUND OF THE INVENTION

1. Field of the Invention

The present invention relates to an assembly.

The present invention further relates to a method of assembling.

The present invention further relates to a tile for use in the assembly.

2. Related Art

An electro-physical transducer is defined herein as a device that converts an electrical signal into a physical phenomenon, or that converts a physical phenomenon into an electrical signal. Examples of the first are electro-luminescent devices, electro-acoustic devices, and electrochrome devices. Examples of the second are photovoltaic devices, acoustic sensors, and touch sensors.

Electro-optical devices are known that are manufactured in the form of a flexible foil. Although this allows certain degrees of freedom it is still not possible to deform such devices into arbitrary shapes, for example in the form of a spherical shape. Although it may be considered to manufacture such devices into a particular predetermined shape for example by successively depositing layers onto a mold having the desired shape, the resulting product can not be formed for another purpose. Let alone that the product is arbitrarily deformable during use. There is a need for electro-physical transducers that can be deformed for other purposes or that even can be arbitrarily deformed during use.

The need for having arbitrarily deformable transducers arises for example from applications in which the electronics is to be readily fitted to a certain three dimensional object, e.g. as a coverage of furniture or car interiors for example.

The need to allow for deformations during use for example arises in medical applications, for example in applications using photon radiation for treatment of the human skin. Another example is in robotics, wherein it is desired to have a touch sensitive function in an artificial skin, having a deformable shape.

It is noted that WO/2009/134127 describes a composite microphone that comprises a flexible and stretchable substrate with a grid of flexible and stretchable first and second conductors. The first conductors are arranged transverse to the second conductors. A plurality of acoustic sensors is each in connection with a respective pair of conductors in the grid. The substrate carrying the acoustic sensors can be arranged upon arbitrary shaped surfaces, for example on a hemispheric surface, therewith obtaining a microphone that is sensitive in a large spatial angle. The acoustic sensors do not substantially limit the freedom of movement of the substrate as the acoustic sensor may occupy only a small portion of the area of the substrate.

In many applications it is desired that the electro-physical property of the transducer is substantially homogeneous while the freedom of movement of the carrier is preserved. For example in case of an electro-optical device for radiation of the human skin it is desired that the human skin is homogeneously irradiated. In case of an artificial skin having touch sensitivity it is desired that it does not have insensitive spots.

SUMMARY OF THE INVENTION

According to a first aspect of the invention an assembly is provided of a plurality of tiles with a carrier. The tiles comprise a foil with an electro-physical transducer and electrical connectors to said transducer, wherein said tiles are mechanically and electrically coupled to the carrier, and wherein the tiles overlay according to a fish scale pattern.

In a fishscale pattern tiles typically are arranged in mutually overlapping rows of mutually overlapping tiles. I.e. in a row each tile is overlapped by a subsequent tile and each row is overlapped by a subsequent row. However also other arrangements are possible. For example the tiles may be arranged in concentric circles, wherein each tile in a circle is overlapped by a subsequent tile and wherein tiles in a circle overlap tiles in a following circle. The wording "overlap" shall be understood to mean that a surface of a tile is at least partially covered by another tile.

Due to their overlap the total area of the carrier that is occupied by the tiles is less than the total surface area of the tiles. Typically the occupied area is a fraction of about 0.3 to about 0.8 of the total surface area of the tiles. If said fraction is substantially less than 0.3, e.g. 0.1, a relatively inefficient arrangement is achieved. For example in case the electro-physical transducers are light-emitting devices this implies that only a small portion of the generated light is radiated to the environment. If said fraction is substantially greater than 0.8, e.g. greater than 0.9, already a minor geometrical distortion of the assembly will result in gaps between the tiles, so that the surface of the carrier is no longer fully covered.

The assembly according to the first aspect of the invention on the one hand is suitably for application on various curved surfaces. As the electro-physical transducers are arranged in mutually separate tiles that are individually coupled to the carrier, the carrier is only modestly restricted in its degrees of freedom. The mutually overlapping of the tiles according to the fish scale pattern provides for a full overlap of the carrier, also in case the carrier is curved or stretched. Therewith the full area of the carrier is available for the functionality of the electro-physical transducer. E.g. in various curved state the full area has a light emitting functionality, or the full area is touch sensitive. The size of the tiles and the amount of overlap can be selected dependent on the maximum specified radius of curvature and/or stretch of the surface on which the assembly is applied. Tiles may comprise a combination of electro-physical transducers, or mutually different tiles may have mutually different transducers.

Dependent on the application the carrier may be flexible and/or stretchable in one or more directions. The carrier may be a foil, e.g. an elastic foil, e.g. a rubber foil, but may alternatively a textile. Even if the individual tiles are rigid, the arrangement as a whole is flexible and/or stretchable.

Flexible and stretchable conductors for use in an elastic medium may be realized for example by providing them in a meandering shape, as described for example in US2007115572. Alternatively materials may be used that are inherently flexible, stretchable and conductive, e.g. a blend of a conductive and a non-conductive polymer as described for example in WO9639707. Use of textile carriers is for example described in WO 2010067283 and WO 2009133497.

In practice tiles comprising an electro-physical transducer may have an active area and a non-active area. E.g. the electro-physical transducer may be arranged in the active area, whereas other components may be arranged in the non-active area. In an embodiment the first active area of tiles of the plurality of tiles overlays the second inactive area of other tiles of the plurality of tiles. Therewith, despite the fact that the individual tiles have a non-active area, it is achieved the area defined by the assembly has no inactive portions.

In a practical embodiment the second inactive area is provided with electric supply contacts for the electro-physical transducer.

In an embodiment having mutually overlaying tiles a non overlayed portion, which is typically the active portion of the tile comprising the electro-physical transducer has a rounded edge. In this way damage to other surfaces in contact with the tiles is prevented.

In an embodiment of the assembly, at least one of the electrical conductors comprises at least a first electrically conductive track, the foil has a first main surface provided with the at least a first electrically conductive track and opposite said first main surface a second main surface facing towards the carrier, at least a first incision extends through the foil alongside said at least a first electrically conductive track, therewith defining a strip shaped portion of the foil that carries a portion of the at least a first electrically conductive track, the at least a first electrically conductive track is electrically connected to an electrical conductor of the carrier, the foil is attached to the carrier with its strip shaped portion.

A strip shaped portion carrying a portion of an electrically conductive track is understood to be a portion of the foil having a length in the direction of the portion of the electrically conductive track that is at least twice its width. Preferably the length of the strip is at least five times its width. The strip shaped portion may be bounded between said at least a first incision and a second incision, or between said at least a first incision and an edge of the foil opposite the portion of the electrically conductive track.

The strip shaped portion of the flexible foil provides for a partial mechanical decoupling of the foil with the carrier, so that the carrier can deform without substantial restrictions, whereas deformations of the carrier do not damage the foil. Despite the partial mechanical decoupling of the foil and the carrier a reliable electrical connection is provided between the electro-physical transducer and electrical conductor of the carrier through the electrically conductive track that is at least partially carried by the strip shaped portion.

In an embodiment thereof the foil has a first and a second mutually opposite side and a third side extending between the first and the second side, the foil comprising a plurality of incisions, each extending from one of the first and the second side, wherein subsequent incisions extend from mutually opposite sides of the foil, therewith forming a meandering strip shaped portion, and wherein said electrically conductive track extends on said meandering strip shaped portion.

In this way it is possible to mechanically decouple an electro-physical transducer from the carrier, even if the foil provided with the transducer is relatively stiff. An even further mechanical decoupling between the electro-physical transducer and the carrier may be achieved when using a relatively flexible foil.

In a variant of this embodiment of the assembly an electrical connection between the at least a first electrically conductive track and the electrical conductor of the carrier is formed by an electrically conductive element extending from the second surface, through the at least a first incision, against the at least a first electrically conductive track. As the incision extends alongside the electrically conductive track the electrical connection between the electrically conductive track and the electrically conductive element has a large tolerance in position, so that the electrical connection can be easily made even if the foil is not very accurately placed on the carrier or if the position of the connections on the carrier are not well defined as is the case in woven or knitted textiles.

According to a second aspect a method is provided of assembling a plurality of tiles with a carrier, said tiles comprising a foil with an electro-physical transducer (10) and electrical connectors to said transducer. The method comprises the steps of mechanically and electrically coupling said tiles to the carrier, and therewith overlaying the tiles according to a fish scale pattern.

According to a third aspect of the present invention a tile is provided that is arranged for use in the assembly.

BRIEF DESCRIPTION OF THE DRAWINGS

FIG. 11A shows a top-view and FIG. 11B shows a side-view according to B in FIG. 11A, FIG. 12A, 12B show a tile for use in a still further alternative embodiment according to the first aspect, therein.

DETAILED DESCRIPTION OF EMBODIMENTS

Figure 1:
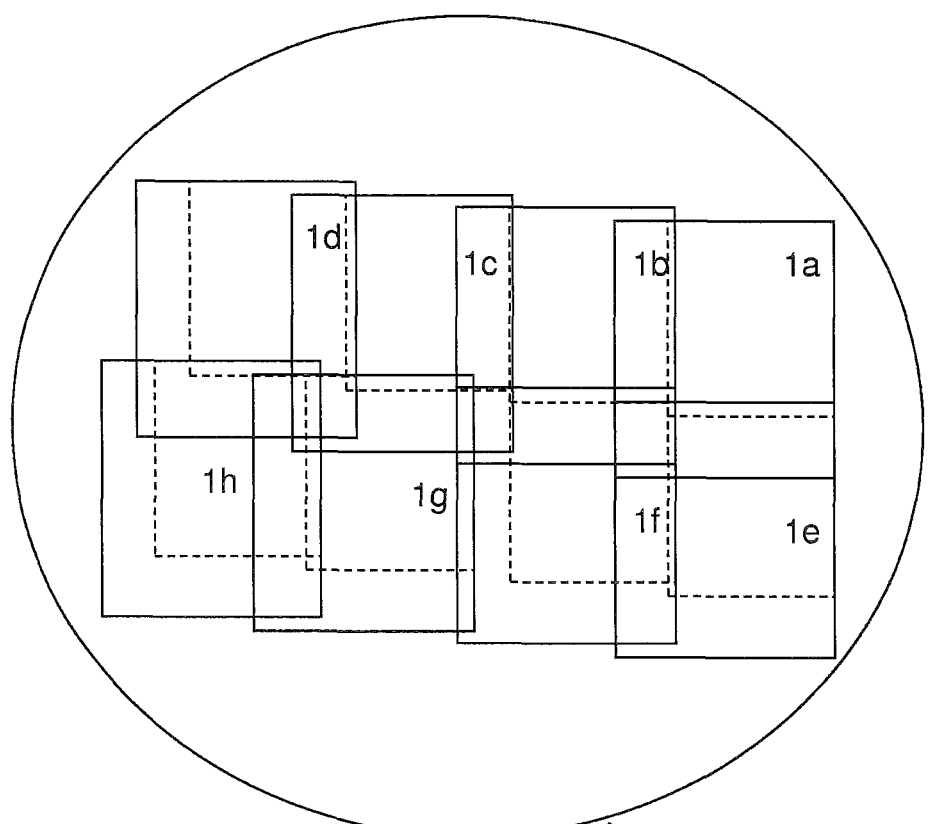
FIG. 1 schematically shows an embodiment of an assembly of tiles and a carrier according to the first aspect of the invention, FIG. 2A, 2B in more detail show a tile of said assembly, therein

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that, although the terms first, second, third etc. may be used herein to describe various items these items should not be limited by these terms. Items are understood to mean features described such components or elements or aspects of components or elements, e.g. a surface of an element or a height of an element. These terms are only used to distinguish one item from another item. Thus, a first item could be termed a second item without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 schematically shows an assembly of a plurality of tiles 1a, ..., 1h, with a carrier 40. The tiles 1a, ..., 1h overlay according to a fish scale pattern. In this embodiment tiles are arranged in mutually overlapping rows of mutually overlapping tiles. A first row comprises tiles 1a, 1b, 1c and 1d. Therein tile 1a is overlapped by tile 1b, tile 1b is overlapped by tile 1c etc. A second row comprises tiles 1e, 1f, 1g, 1h. Therein tile 1e is overlapped by tile 1f, tile 1f is overlapped by tile 1g etc. The first row with tiles 1a, ... 1d, is overlapped by the second row with tiles 1e, ..., 1h.

Figure 5A:
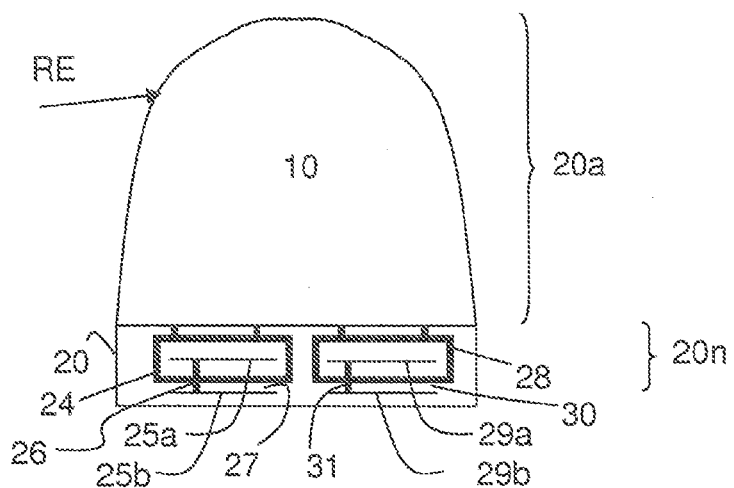
FIG. 5A shows an other example of a tile.

Typically the tiles are square with a side in the range of 1 to 15 cm, but also smaller sizes are possible, e.g. from 50 μm onwards. Also other shapes are possible, as shown in FIG. 5A, for example.

FIGS. 2A and 2B show one of the tiles, here tile 1a, in more detail. Therein FIG. 2A shows a top view and FIG. 2B shows a side view according to B in FIG. 2A. In FIG. 2A it is shown that the tile 1a comprises a foil 20 with an electro-physical transducer 10 and electrical connectors 24, 28 to said transducer. The tile 1a is mechanically and electrically coupled to the carrier 40.

In the embodiment shown the electrical connectors 24, 28 each comprise an electrically conductive track. The foil 20 has a first main surface 22 provided with the electrically conductive tracks 24, 28 and opposite said first main surface 22 a second main surface 23 (See FIG. 2B) facing towards the carrier 40.

At least a first incision 25a extends through the foil 20 alongside said at least a first electrically conductive track 24, and therewith defines a strip shaped portion 27 of the foil that carries a portion of the at least a first conductive track 24. In the embodiment shown the strip shaped portion 27 is bounded on a side opposite the first incision by a second incision 25b. In another embodiment the stripshaped portion may be bounded by an edge of the foil 20.

The at least a first electrically conductive track 24 is electrically connected to an electrical conductor 421 of the carrier 40, by an electrically conductive element 26 extending from the second main surface 23, through the at least a first incision 25a, against the at least a first electrically conductive track 24. The electrically conductive element 26 in addition provides for a mechanical connection of the foil 20 to the carrier 40. Alternatively or in addition a mechanical connection may be formed by other means, e.g. by magnetic means, or by an adhesive, e.g. a hot-melt adhesive, such as a polyurethane or alternatively an epoxy-based adhesive.

In the assembly shown in FIG. 2A and FIG. 2B, the electro-physical transducer is an OLED and the at least a first electrically conductive track 24 serves as an anode contact of the OLED. The foil 20 is provided with a second electrically conductive track 28 that serves as a cathode contact. A first and a second further incision 29a, 29b extend on mutually opposite sides alongside the second electrically conductive track 28 and defines a second strip shaped portion 30. Likewise the second electrically conductive track 28 is electrically connected to an electrical conductor 422 of the carrier 40, by a further electrically conductive element 31. Likewise the further electrically conductive element 31 provides for a mechanical connection with the substrate 40.

The first and the second strip shaped portions 27, 30 allow the remainder of the foil 20 to move with respect to the carrier 40 while a reliable electric connection is realized with the conductors of the carrier 40. The strip shaped portions may be modified to change its mechanical properties, such as its deformability, for example by irradiation, by chemical processing, or by other means.

In the assembly shown in FIGS. 2A and 2B, the first and the second strip shaped portions 27, 30 are arranged in mutually transverse directions at mutually neighbouring sides of the OLED.

Figure 2:
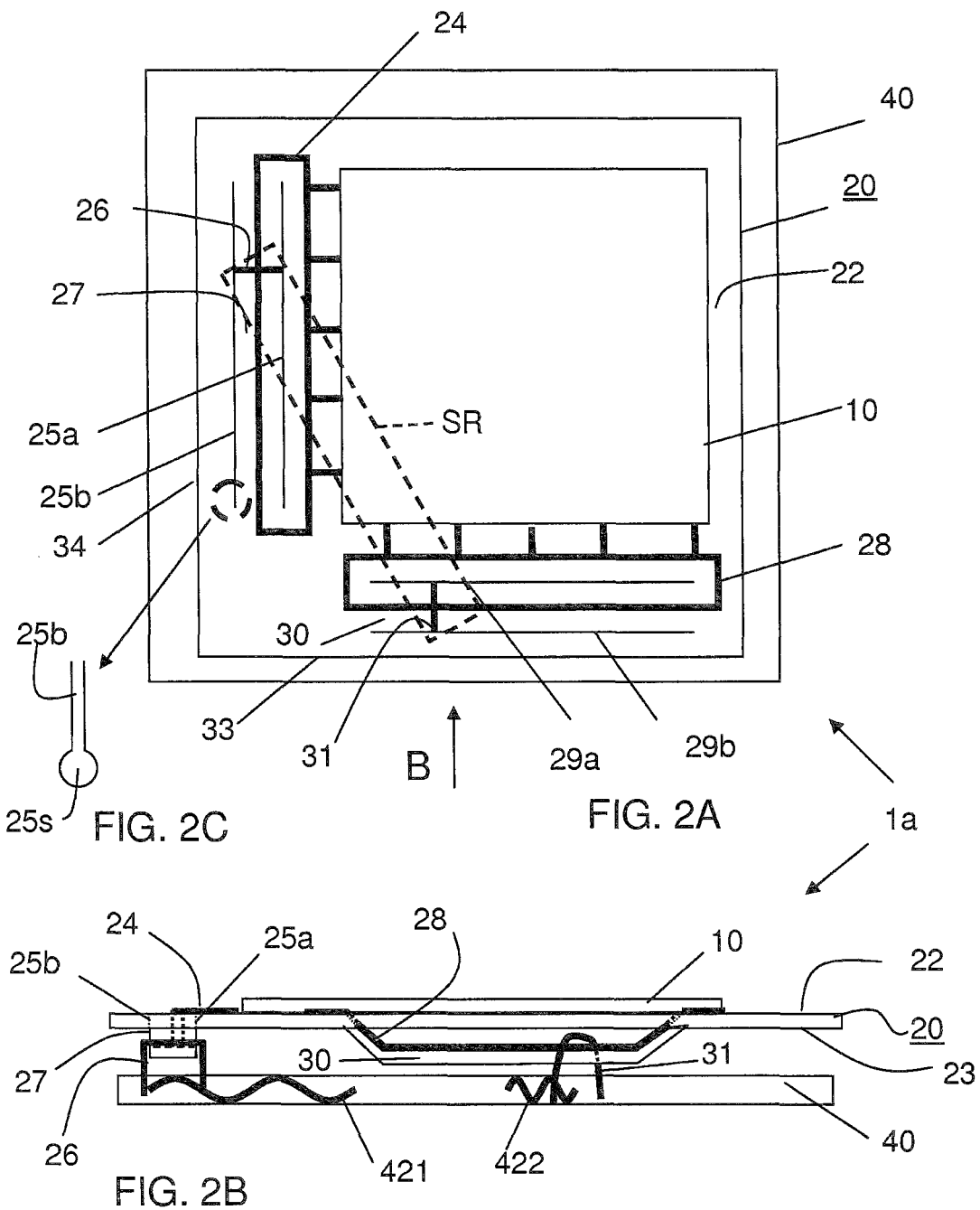
FIG. 2A shows a top-view.
FIG. 2B shows a side-view according to B in FIG. 2A.
FIG. 2C shows a detail of FIG. 2A.

In FIG. 2A it can be seen that the strip shaped portion 27 extends between the electro-physical transducer 10 and a side 34 of the foil 20 in a direction alongside said side 34. Likewise, the strip shaped portion 30 extends between the electro-physical transducer 10 and a further side 33 of the foil 20 in a direction alongside said further side 33. An alternative possibility is illustrated in FIG. 12. The arrangement of FIG. 2 is advantageous in that a relatively large area of the foil 20 is available for the electro-physical transducer 10.

With respect to FIG. 2A it is further noted that a smallest rectangle SR surrounding each of the connections of the foil 20 to the carrier 40 has an area of at most 10% of the area of the first main surface of the foil. In this case the rectangle SR surrounds the electrically conductive elements 26 and 31 that mechanically (and electrically) connect the foil to the carrier. Other connections may be formed for example by magnetic or adhesive elements. Such connections may additionally form an electrical connection. In the embodiment shown the smallest rectangle SR surrounding the connections formed by the elements 26, 31 has an area of (1.2× 8.9=) 10.7 units. The first main surface 22 of the foil 20 has an area of (10.9×11.4=) 124 units. Accordingly the area of the smallest rectangle is about 8.6% of the area of the main surface of the foil 20. The relatively small area of not more than 10% occupied by the mechanical contact between the foil 20 and the carrier 40 further enhances mobility of the carrier 40.

Figure 3:
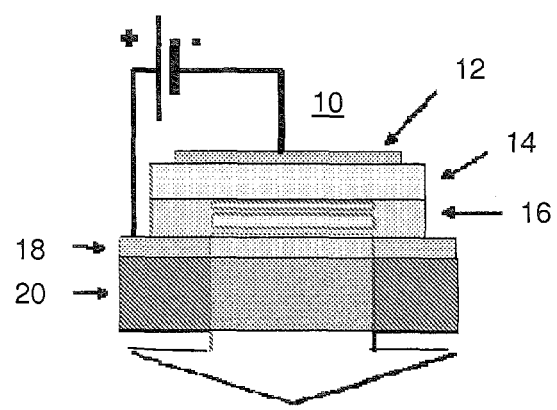
FIG. 3 shows part of the tile in more detail.

FIG. 3 shows an example of an OLED that may form the electro-physical transducer 10 in the assembly according to the first aspect. The OLED 10 is arranged on a foil 20 and comprises a cathode 12, a light-emitting polymer 14 and an anode 16. The OLED comprises an encapsulation 18 of which a portion is shown. In other embodiments another type of light-emitting element may be used as the transducer, for example an inorganic light-emitting diode. Also other types of electro-physical transducers may be used, such as photo-voltaic cells, acoustical transducers, touch sensitive elements, etc.

By way of example it is shown in FIG. 3C for incision 25b, that it ends into an incision prolongation stopper 25s in the form of a circularly widened end.

Figure 4:
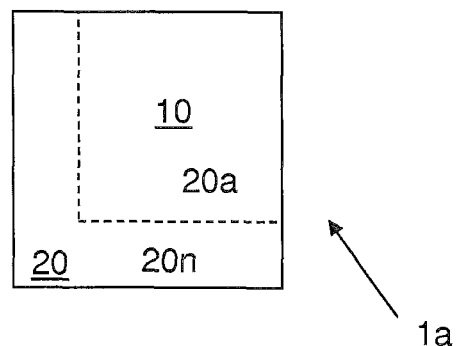
FIG. 4 shows a layout of a tile.

As shown in FIG. 4, the tiles, e.g. 1a, each comprise a first, active area 20a. The active area 20a is formed by the transducer 10. A remaining area 20n of the tile 1a is inactive. In the embodiment shown in FIG. 2A, 2B the inactive area is provided with electric supply contacts for the electro-physical transducer 10, i.e. the electrical connectors 24 and 28.

Turning back to FIG. 1 it can be seen that the first active area of tiles 1e-1h of the plurality of tiles overlays the second inactive area of other tiles 1a-1d of the plurality of tiles.

Figure 5B:
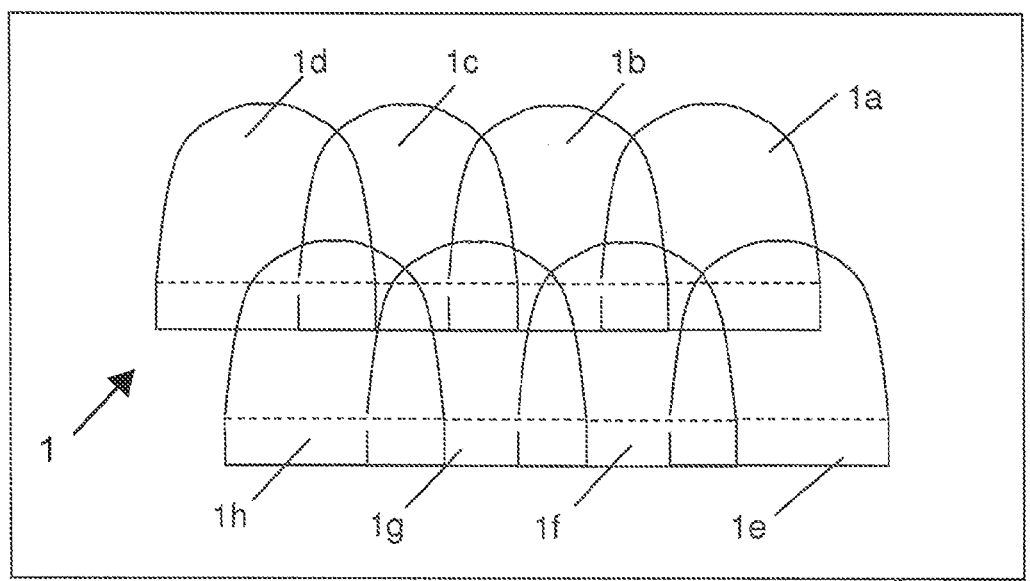
FIG. 5B shows a further embodiment of an assembly according to the first aspect of the invention with tiles as shown in FIG. 5A.

FIG. 5A, 5B shows another example of an assembly according to the first aspect of the present invention. FIG. 5A shows another example of a tile. Parts therein corresponding to those in FIG. 2A have a similar reference number. In the embodiment of FIG. 5A, the active portion formed by OLED 10 has a rounded edge RE.

Figure 6:
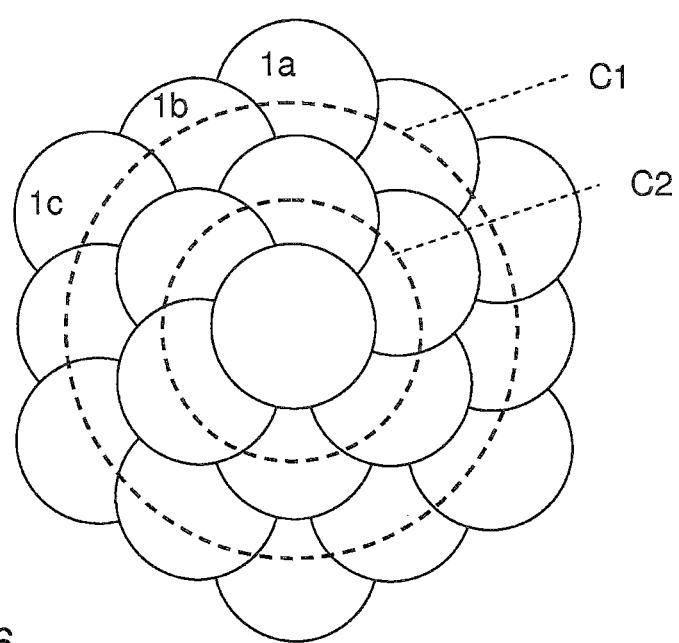
FIG. 6 shows a still further embodiment of an assembly according to the first aspect of the invention.

FIG. 5B schematically shows a fish scale pattern of an assembly of tiles 1 as shown in FIG. 5A. Therein the active portions 20a of tiles 1e-1h overlap the inactive portions 20n of tiles 1a-1d. The active portions 20a are substantially not overlayed. The rounded edge RE of the active portions 20a prevents damage to an environment in contact with the assembly. This is valuable for example for skin irradiation therapy, wherein an assembly as shown in FIG. 5B is wrapped around the human skin Also other overlapping arrangements may be considered. For example, as shown in FIG. 6, the tiles may be arranged in concentric circles, C1, C2 wherein each tile in a circle is overlapped by a subsequent tile and wherein tiles in a circle overlap tiles in a following circle. For example tile 1b in circle C1 overlaps tile 1a in that circle. Tile 1c overlaps tile 1b in circle C1 etc. The tiles in circle C2 overlap the tiles in circle C1 etc.

In again another embodiment the tiles are arranged along a spiral.

The mechanical and electrical coupling of the tiles to the carrier may be realized in various ways. In the embodiment shown in FIGS. 2A and 2B the tile 1a is coupled mechanically and electrically to the carrier 40 by electrically connective elements 26 and 31 that each are wrapped around a strip shaped portion 27, 30. More detailed examples of this coupling are described with reference to FIG. 7 and FIG. 8.

Figure 7:
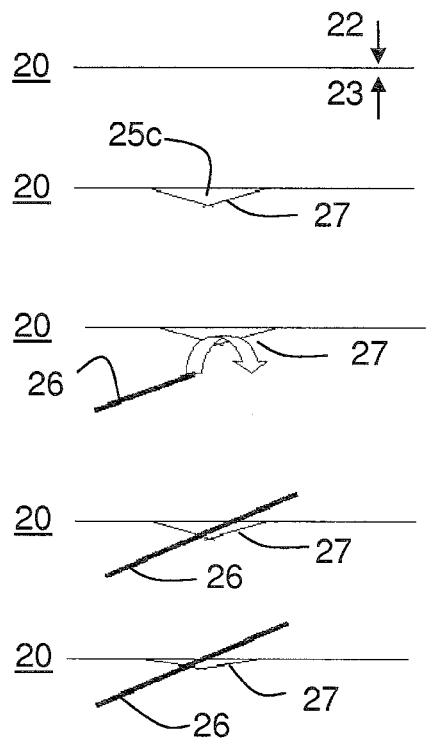
FIG. 7 shows in more detail a way of assembling in a method according to the second aspect according to the invention.

The first illustration (1) in FIG. 7 shows the foil 20. The second illustration (2) shows the strip shaped portion 27 that is bended out of the plane of the remainder of the foil 20. Therewith an opening 25c is formed. The strip shaped portion 27 may be bended down for example by a tool that presses said portion 27 downward. Alternatively the strip shaped portion 27 may have magnetic elements that are pulled downward by a magnetic tool. The third illustration (3) shows how an electrically conductive element 26 is fed through the opening against the at least a first electrically conductive track carried by the strip shaped portion 27. The fourth illustration (4) shows the result thereof. The fifth illustration (5) shows the foil 20 after the strip shaped portion is released and has bent back.

Figure 8:
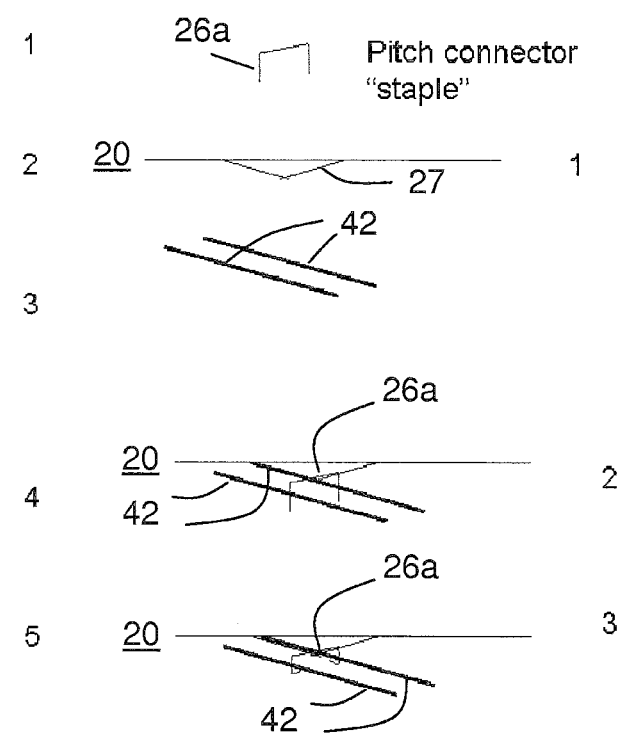
FIG. 8 shows in more detail an alternative way of assembling in a method according to the second aspect according to the invention.

FIG. 8 shows an alternative, wherein a staple like pitch 26a is used to connect the electrically conductive track to an electrical conductor 42 of the carrier, in this case to a pair of electrical conductors 42 (See illustration 1). The second illustration (2) shows the staple like pitch 26a pressed downwards. In the illustration the staple like pitch 26a embraces the electrical conductors 42 of the carrier, so that an electrical connection is formed between these electrical conductors and the electrically conductive track on the strip shaped portion 27, as shown in the third illustration (3).

Figure 8A:
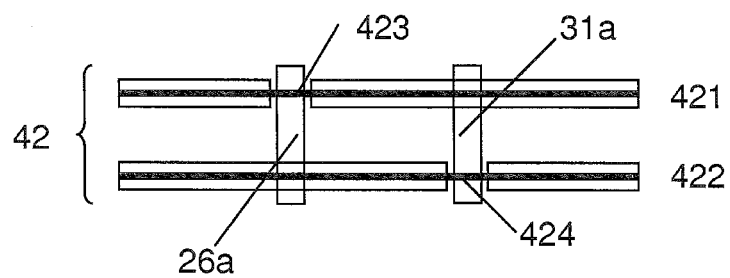

In this case a pair of electrical conductors 42 (See FIG. 8A) comprises a first electrical conductor 421 having electric contact 423 and a second electrical conductor 422 having electric contact 424. The second illustration (2) shows the staple like pitch 26a pressed downwards. In the illustration the staple like pitch 26a embraces the electrical conductors 421, 422 of the carrier so that a mechanical connection is formed with both conductors. However, an electric connection is formed only with electrical conductor 421 at its electrical contact 423. Analogously the second staple like pitch 31a only forms an electric connection with electrical conductor 422 at its electrical contact 424.

Figure 9:
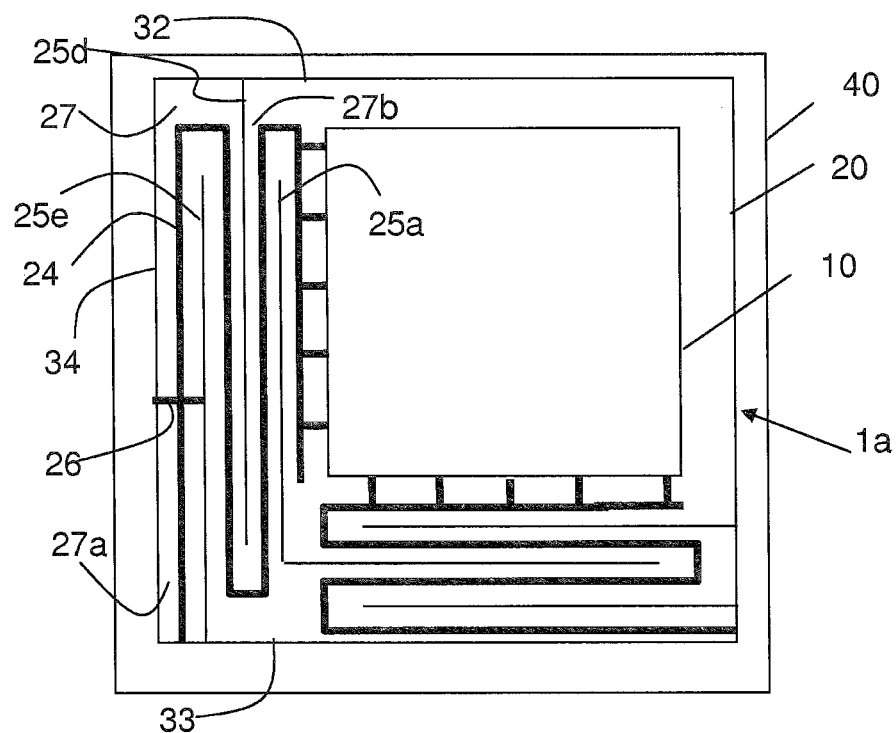
FIG. 9 shows a tile for use in an alternative embodiment according to the first aspect.

FIG. 9 shows a further assembly wherein the foil 20 has a first and a second mutually opposite side 32, 33 and a third side 34 extending between the first and the second side. In this case the foil has a plurality of incisions 25d, 25e that each extend from one of the first and the second side 32, 33 respectively. Subsequent incisions 25d, 25e extend from to mutually opposite sides of the foil, therewith forming a strip 27 that meanders from an end 27a to an end 27b. The electrically conductive track 24 extends on said meandering strip 27. In the embodiment of FIG. 7, the electrically conductive element 26 extends from the incision 25e to the outer edges 34 of the foil 20. In this embodiment a further mechanical decoupling between the carrier 40 and the tiles 1a is achieved.

Figure 10:
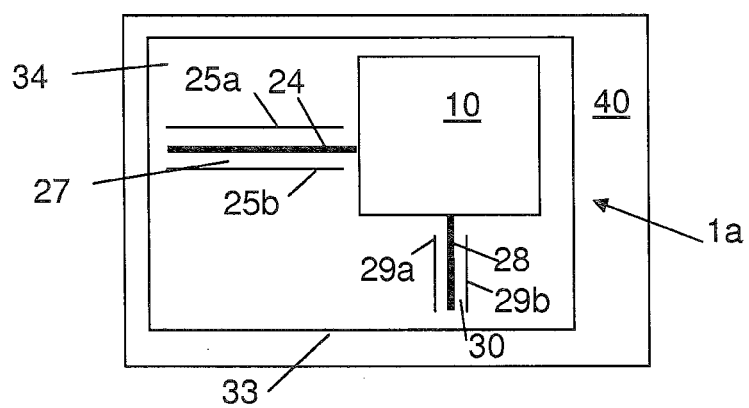
FIG. 10 shows a tile for use in a further alternative embodiment according to the first aspect.

FIG. 10 shows an alternative arrangement for the strip shaped portions 27. Therein the strip shaped portion 27 extends between the electro-physical transducer 10 and a side 34 of the foil 20 in a direction transverse to said side 34. Likewise, the strip shaped portion 30 extends between the electro-physical transducer 10 and a further side 33 of the foil 20 in a direction transverse to said further side 33.

Figure 11A:
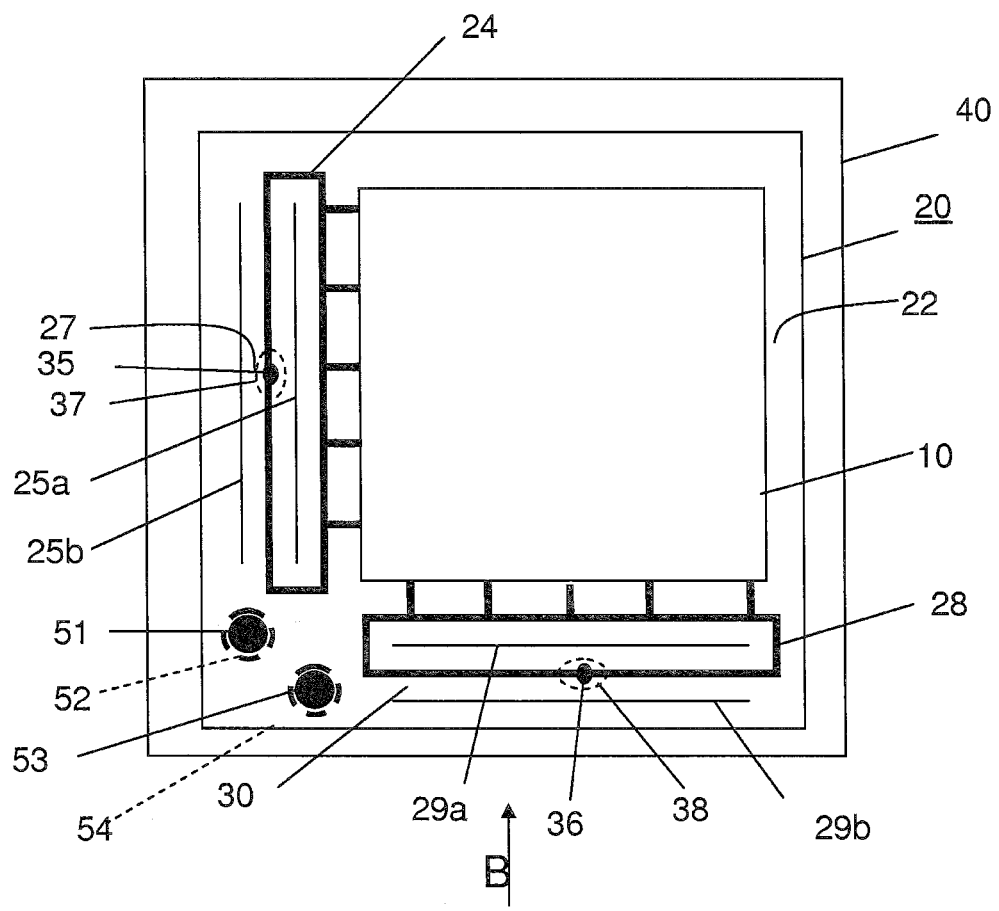
FIG. 11A, 11B show a tile for use in a still further alternative embodiment according to the first aspect, therein.
Figure 11B:
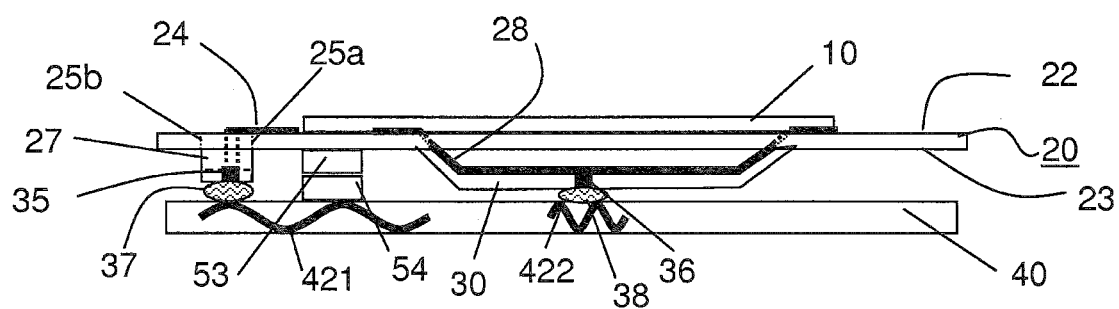

FIGS. 11A and 11B show a further embodiment of an assembly according to the first aspect of the invention. Parts therein corresponding to those in FIGS. 2A and 2B have the same references.

In the embodiment shown in FIGS. 11A and 11B the second main surface 23 of the foil 20 is provided with a first and a second mutually opposite magnetic pole 51, 53. The magnetic poles 51, 53 of the foil 20 are magnetically coupled to respective magnetic poles 52, 54 provided on the surface of the carrier 40. For clarity magnetic poles 51 and 52 are only shown in FIG. 11A. The magnetic poles on the second main surface 23 of the foil and their counterparts 52, 54 on the carrier, facilitate alignment of the foil 20 with the carrier 40.

In the embodiment of FIG. 11A, 11B an electrical connection between the at least a first electrically conductive track 24 and the electrical conductor 421 of the carrier 40 includes an electrically conductive member 35 extending from said at least a first electrically conductive track 24 through the foil 20. Likewise an electrical connection between the electrically conductive track 28 and a further electrical conductor 422 of the carrier 40 includes an electrically conductive member 36 extending from the electrically conductive track 28 through the foil 20. In the embodiment shown the electrically conductive member 35 is electrically connected to the electrical conductor 421 of the carrier via an electrically conductive adhesive 37, such as an epoxy based adhesive filled with Ag, arranged between the foil and the carrier. Likewise the electrically conductive member 36 is electrically connected to the further electrical conductor 422 of the carrier 40 via another electrically conductive adhesive 38 arranged between the foil and the carrier. The magnetic adherence provided by the paired magnetic poles 51, 52 and 53, 54 keeps the foil in place while the adhesive 37, 38 is cured. A separate tool for that purpose is superfluous.

Figure 12A:
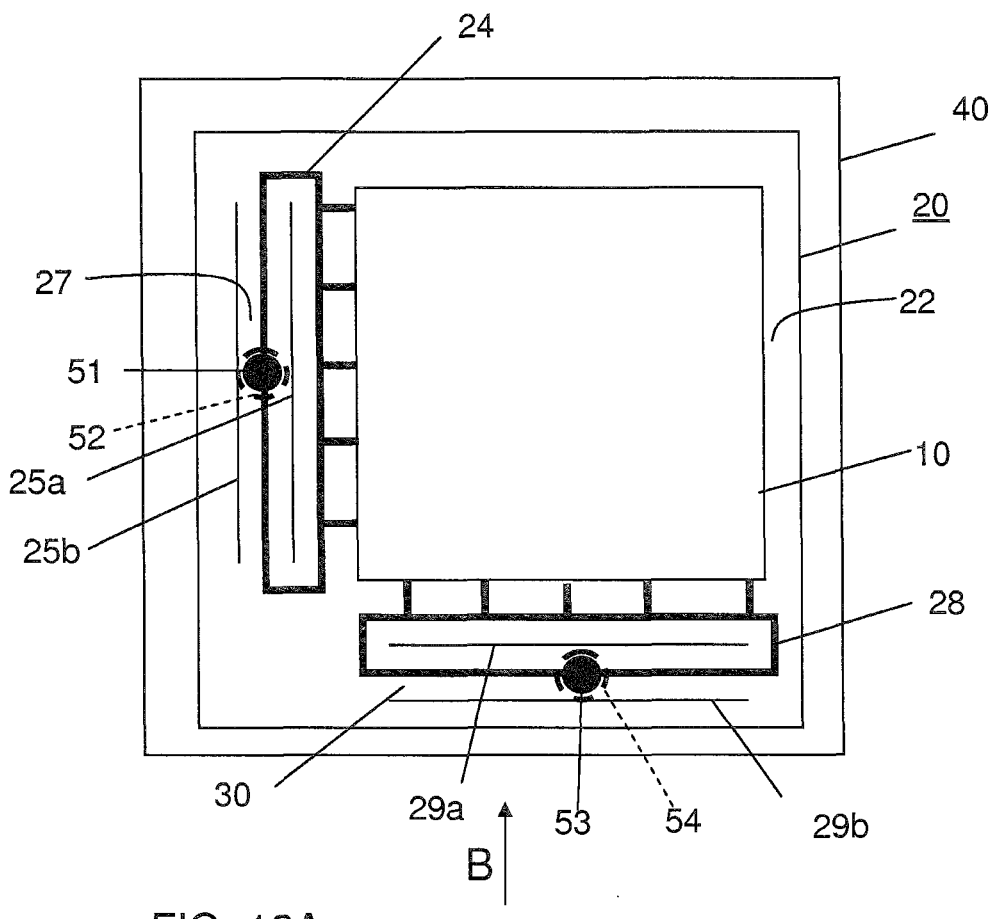
FIG. 12A shows a top-view and FIG. 12B shows a side-view according to B in FIG. 12A, FIG. 13A, 13B show a tile for use in a still further alternative embodiment according to the first aspect, therein.
Figure 12B:
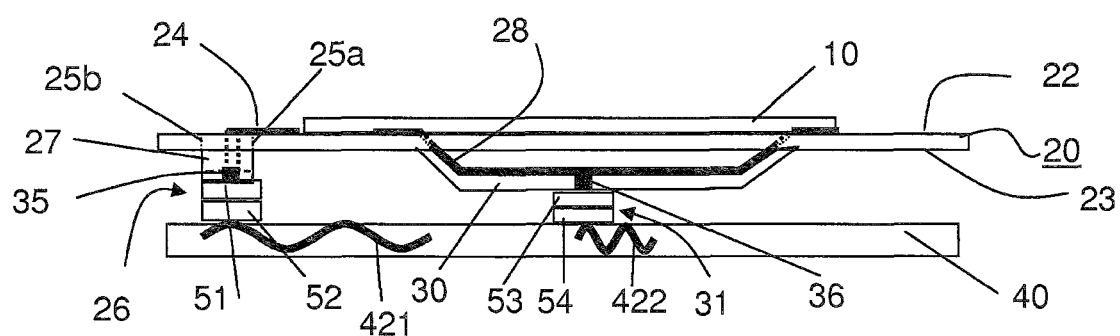

FIGS. 12A and 12B show a further embodiment of an assembly according to the first aspect of the invention. As in the embodiment of FIG. 11A, 11B the electrically conductive tracks 24, 28 are coupled to electrical conductors 421, 422 of the carrier 40 via respective electrically conductive members 35, 36 that extend from the electrically conductive tracks 24, 28 through the foil 20. In this embodiment however, the electrical connections each further includes a pair of magnetic poles.

The electrical connection to conductive track 24 is provided via a first magnetic pole 51 arranged on the second main surface 23 of the foil 20 and a second magnetic pole 52 arranged on the main surface of the carrier 40. The poles 51, 52 cooperate, i.e. are of mutually opposite polarity, so that a mechanical connection is provided by magnetic force. Likewise poles 53 and 54 cooperate. The magnetic attraction may be strong enough to provide for a sufficient adherence of the foil 20 to the carrier 40. Nevertheless the foil 20 may be adhered to the carrier 40 by other means. For example the foil 20 may be additionally adhered to the carrier 40 by an adhesive. For example an electrically conductive adhesive may be used that is arranged between the mutually cooperating poles.

Figure 13A:
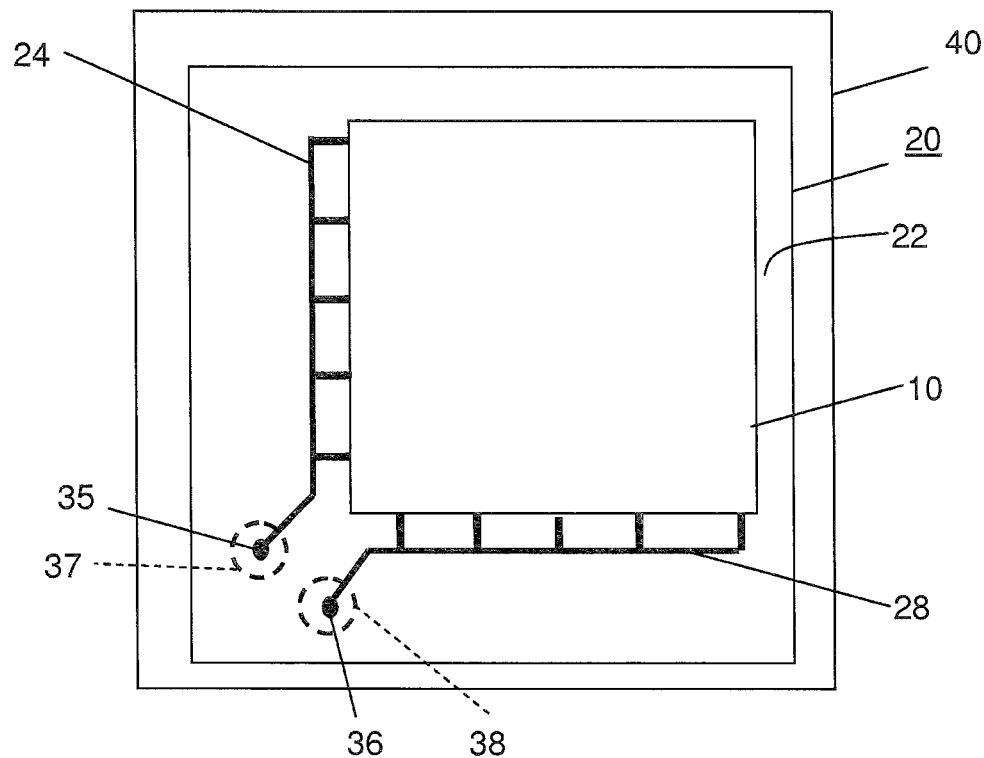
FIG. 13A shows a top-view and FIG. 13B shows a side-view according to B in FIG. 13A.
Figure 13B:
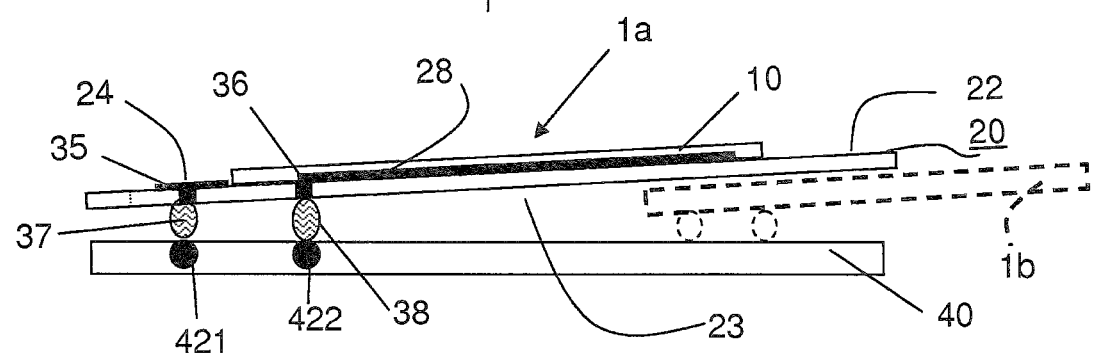

The assembly according to the first aspect does not necessarily have strip shaped portions for decoupling. FIG. 13A, 13B show a further embodiment, wherein the foil 20 carrying the electro-physical transducer 10 is directly coupled by electrically conductive adhesive elements 37, 38 to the carrier 40. The adhesive elements 37, 38 also provide fro an electrical connection between the electrical connectors 24, 28 of the electro-physical transducer 10 with electrical conductors 421, 422 of the carrier. The tile 1a is partly supported by the adhesive elements 37, 38 and partly by other tiles, one of which, tile 1b is schematically shown in FIG. 13B by dashed lines.

Figure 14:
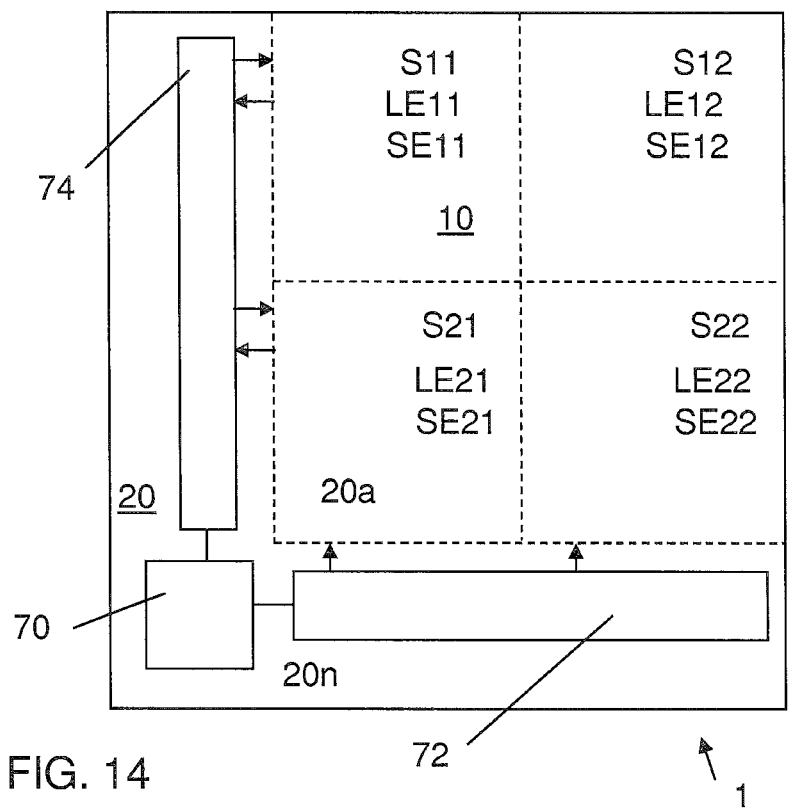
FIG. 14 shows a tile for use in again another embodiment according to the first aspect.

FIG. 14 shows a further embodiment of an assembly according to the first aspect. claim 1. Therein each tile 1 comprises a control facility 70, 72, 74 and has an active area 20a that is partitioned into a plurality of sections S11, S12, S21, S22. Each section comprises a light emitting element LE11, LE12, LE21, LE22 as an electro-physical transducer and a sensor element SE11, SE12, SE21, SE22 as a further electro-physical transducer for sensing whether said section is covered by another tile or not. The control facility is arranged to selectively activate only the electro-physical transducers in the sections for which it is sensed that they are at least partially uncovered.

In the embodiment shown the active area is portioned as a matrix with columns and rows. The control facility comprises a main controller 70, a column driver 72 and a row driver 74. The columndriver 72 alternatingly selects one of the columns and the rowdriver reads the status from the sensor elements in said column, for example from sensor elements SE11 and SE21 if the first column is selected. If the sensor elements indicate that the corresponding section is at least partially uncovered the corresponding light emitting element, LE11, LE21 is maintained in or set into an active state. If the sensor elements indicate that the corresponding section is fully covered by another tile the light emitting element is set into a deactivated state, or maintained in a deactivated state if it was already deactivated.

The sensor elements SE11, SE12, SE21, SE22 may for example capacitively detect the presence of a covering tile. Alternatively the sensor elements may detect an amount reflected by covering tiles. In the latter case, a deactivated section may periodically pulsewise energize its light emitting element to probe whether the section is still fully covered or not.

The condition for activating a section may be selected depending on the application. The condition may for example be that the light emitting element of a section is activated if more than x % of the section is uncovered. In applications where a homogeneous irradiation is very important, the value of x may be set at a very low threshold, for example of 1%. In this way a section is activated as soon as a minor portion is uncovered. In other embodiments the value of x may be higher, e.g. at 50%.

In some embodiments the sensor may not be arranged to accurately detect a covering percentage. In this case still a highly homogeneous irradiation pattern may be achieved, provided that the active area is partitioned in a sufficient number of sections.

For clarity, in the example shown the active area 20a of the assembly is partitioned in only 4 sections. The matrix structure of this arrangement however allows an easy extension to a larger number of sections. In other embodiments the number of sections may be substantially higher, for example a few hundreds of sections, or even more.

Instead of using a shared control facility, as show in FIG. 14, it is alternatively possible that each section comprises a proper control element that switches the light-emitting element on or off dependent on whether its sensor element detects that the section is covered or not.

Figure 15:
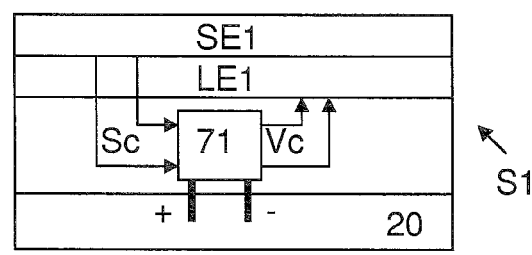
FIG. 15 shows a tile for use in again another embodiment according to the first aspect.

FIG. 15 schematically shows an example of such a section S1. Section 51 of a tile comprises a sensor element SE1, a light-emitting element LE1 and a control element 71. The control element 71 is supplied by power supply lines +, −. On its turn the control element controllably provides the light emitting element with a supply voltage Vc. Depending on a sensor signal Sc, received from the sensor element SE1 it activates the light-emitting element LE1. The sensor element SE1 for example detects an amount of radiation emitted by light-emitting element LE1 that is reflected. If it is sensed that the amount of reflected light is higher than a predetermined threshold value the control element 71 deactivates the light-emitting element LE1 or maintains the deactivated state. During a deactivated state of the section the control element 71 may periodically pulsewise energize its light emitting element LE1 to determine, on the basis of the sensor signal Sc, whether the section is still fully covered or not. In an application the control element 71 may for example energize its light-emitting element once each second during a millisecond. In this way the power consumption by covered sections is substantially reduced (here a factor 1000), while it is still possible to rapidly reactivate a section if it has become (partially) uncovered. Of course in other embodiments the period and duration of energizing for probe purposes may be different. For example, the period may be selected in a range of 0.01 s to 10 s and the duration may be selected in a range from 0.0001 to 0.1 the duration of said period.

An arrangement wherein each section has its own control element can also be easily expanded to a large number of sections, as the number of electrically conductive lines to the sections can be very limited. It is sufficient that the tile is provided with a power supply grid for the power supply lines +, −.

It is noted that the wording light emitting element is not restricted to elements that emit visible light, but also includes elements that are capable of irradiating in the infrared and/or the ultraviolet range.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. Assembly comprising a plurality of tiles with a carrier that is flexible and/or stretchable in one or more directions, said tiles comprising a foil with an electro-physical transducer and electrical connections to said transducer via at least one electrically conductive track, wherein at least one electrically conductive element, extending through an area overlapped by the foil, electrically connects the at least one electrically conductive track with at least one electrical conductor of the carrier,
wherein the foil comprises a portion that is movable with respect to the carrier.

2. Assembly according to claim 1, wherein each tile comprises a first, active area and a second, inactive area, wherein the first active area of tiles of the plurality of tiles overlays the second inactive area of other tiles of the plurality of tiles.

3. Assembly according to claim 2, wherein the second inactive area is provided with the electrical connections to the electro-physical transducer.

4. Assembly according to claim 2, wherein the active area of the tiles has a rounded edge.

5. Assembly according to claim 1, wherein
the foil has a first main surface provided with the at least one electrically conductive track and opposite said first main surface a second main surface facing towards the carrier,
at least a first incision extends through the foil alongside said at least one electrically conductive track, therewith defining a strip shaped portion of the foil that carries a portion of the at least one electrically conductive track, and
the foil is attached to the carrier with the strip shaped portion.

6. Assembly according to claim 5, wherein the electrically conductive element extends from the second surface, through the first incision, against the electrically conductive track.

7. Assembly according to claim 5, wherein the foil has at least a second incision extending through the foil at a side of said electrically conductive track opposite the first incision, and wherein the electrically conductive element further extends through said second incision.

8. Assembly according to claim 5, wherein the electrically conductive track serves as a first contact of the electro-physical transducer and wherein the foil is provided with a second electrically conductive track that serves as a second contact.

9. Assembly according to claim 8, wherein said second electrically conductive track is electrically connected to a further electrical conductor of the carrier in a way analogous to the way the electrically conductive track is electrically connected to the electrical conductor of the carrier, a portion of said second electrically conductive track being carried by a second strip shaped portion.

10. Assembly according to claim 9, wherein said first and said second strip shaped portions are arranged in mutually transverse directions and at mutually neighbouring sides of the electro-physical transducer.

11. Assembly according to claim 1, wherein the electro-physical transducer is an OLED and wherein the electrically conductive track serves as a contact to an anode of the OLED, the assembly further comprising further electrical connections to the OLED via a second electrically conductive track that serves as a cathode of the OLED.

12. Assembly according to claim 6, wherein the electrically conductive element is an electrically conductive wire.

13. Assembly according to claim 12, wherein the electrically conductive wire is a spring.

14. Assembly according to claim 6, wherein the electrically conductive element is a staple like pitch.

15. Assembly according to claim 1, wherein said carrier is a textile.

16. Assembly according to claim 1, wherein said carrier is a foil.

17. Assembly according to claim 1, wherein said carrier is stretchable.

18. Assembly according to claim 5, wherein said at least one incision ends into an incision prolongation stopper.

19. Assembly according to claim 1, wherein the foil has a first and a second mutually opposite side and a third side extending between the first and the second side, the foil comprising a plurality of incisions, each extending from one of the first and the second side, wherein subsequent incisions extend from mutually opposite sides of the foil, therewith forming a meandering strip shaped portion, and wherein said electrically conductive track extends on said meandering strip shaped portion.

20. Assembly according to claim 1, wherein each tile comprises a control facility and has an active area that is partitioned into a plurality of sections, wherein each section comprises a light emitting element as an electro-physical transducer and a sensor element as a further electro-physical transducer for sensing whether said section is covered by another tile or not, wherein the control facility is arranged to selectively activate only the electro-physical transducers in the sections for which it is sensed that they are at least partially uncovered.

21. Method of assembling the assembly of claim 1 comprising the plurality of tiles with the carrier, said tiles comprising the foil with the electro-physical transducer and electrical connections to said transducer, comprising the steps of mechanically and electrically coupling said tiles to the carrier, and therewith overlaying the tiles according to a fish scale pattern.

22. A tile, arranged for use in the assembly of claim 1.

23. Assembly according to claim 1, wherein said tiles are mechanically and electrically coupled to the carrier, and wherein the tiles overlap according to a fish scale pattern, whereby a surface of at least one tile of said plurality of tiles is at least partially covered by another tile of said plurality of tiles.

24. Assembly according to claim 1 the assembly of said tiles with said carrier as a whole being flexible and/or stretchable.

25. Assembly according to claim 1, wherein the assembly of said tiles with said carrier is arbitrarily deformable over a curved surface.

\* \* \* \* \*